(12) United States Patent
Shin et al.

(10) Patent No.: US 8,416,293 B2
(45) Date of Patent: Apr. 9, 2013

(54) PLASMA MONITORING DEVICE AND METHOD

(75) Inventors: Heung Hyun Shin, Seoul (KR); Woo Jung Ahn, Seongnam-si (KR)

(73) Assignee: SNU Precision Co. Ltd., Seoul (KR)

( * ) Notice: Subject to any disclaimer, the term of this patent is extended or adjusted under 35 U.S.C. 154(b) by 0 days.

(21) Appl. No.: 12/595,365

(22) PCT Filed: Apr. 10, 2008

(86) PCT No.: PCT/KR2008/001999
§ 371 (c)(1),
(2), (4) Date: Oct. 9, 2009

(87) PCT Pub. No.: WO2008/130118
PCT Pub. Date: Oct. 30, 2008

(65) Prior Publication Data
US 2010/0149326 A1    Jun. 17, 2010

(30) Foreign Application Priority Data
Apr. 18, 2007   (KR) .................. 10-2007-0037896

(51) Int. Cl.
*B05B 1/00*     (2006.01)
*B05B 15/00*    (2006.01)
*A61B 1/06*     (2006.01)

(52) U.S. Cl. ............. 348/92; 348/94; 348/95; 348/165; 382/107

(58) Field of Classification Search ............ 348/92
See application file for complete search history.

(56) References Cited

U.S. PATENT DOCUMENTS

| | | | | |
|---|---|---|---|---|
| 2,910,908 A | * | 11/1959 | Meyer, Jr. | 356/629 |
| 3,533,706 A | * | 10/1970 | Byal et al. | 356/239.1 |
| 3,742,901 A | * | 7/1973 | Johnston | 118/669 |
| 4,144,837 A | * | 3/1979 | Johnston | 118/680 |
| 5,045,669 A | * | 9/1991 | Ortiz et al. | 219/121.83 |

(Continued)

FOREIGN PATENT DOCUMENTS

| | | | |
|---|---|---|---|
| JP | 01110735 A | | 4/1989 |
| JP | 09036102 A | * | 2/1997 |

(Continued)

OTHER PUBLICATIONS

Sauer, J.P. and Sahoo, P. "HVOF Process Control Using Almen and Temperature Measurement". Thermal Spray 2001: New Surfaces for a New Millennium. (2001) Ed. Berndt et al. p. 791-796.*

*Primary Examiner* — Sath V Perungavoor
*Assistant Examiner* — Matthew J Anderson
(74) *Attorney, Agent, or Firm* — Volpe and Koenig, P.C.

(57) ABSTRACT

A plasma monitoring device includes a plasma supplier including a power supply, a reaction gas supply line, and an emission nozzle for emitting plasma, which is generated therein, toward an object; a camera unit for obtaining an image of the plasma emission state; and a controller for obtaining a measurement value by converting pixel information of the image into a numerical value and comparing it with a reference value, which is a measurement value in a normal emission state, to check the plasma emission state. The camera unit obtains an image of the plasma emission state, and the controller analyzes the image to obtain a measurement value, which is used to monitor the state of plasma in real time and control the amount of reaction gas supplied to the plasma supplier and the plasma discharge condition, so that plasma is evenly emitted from the plasma supplier.

7 Claims, 6 Drawing Sheets

U.S. PATENT DOCUMENTS

| | | | |
|---|---|---|---|
| 5,170,060 A * | 12/1992 | Maillard et al. | 250/559.03 |
| 5,642,190 A * | 6/1997 | Krupa et al. | 356/316 |
| 5,789,040 A * | 8/1998 | Martinu et al. | 427/575 |
| 5,986,277 A * | 11/1999 | Bourque et al. | 250/554 |
| 6,437,357 B1 * | 8/2002 | Weiss et al. | 250/559.4 |
| 6,797,939 B2 * | 9/2004 | Bayer et al. | 250/226 |
| 6,832,577 B2 * | 12/2004 | Nesbitt | 118/713 |
| 6,967,304 B2 * | 11/2005 | Gevelber et al. | 219/121.47 |
| 7,043,069 B1 * | 5/2006 | Heinrich et al. | 382/141 |
| 7,345,698 B2 * | 3/2008 | Abbott et al. | 348/86 |
| 7,395,779 B2 * | 7/2008 | Ishii et al. | 156/345.41 |
| 7,404,860 B2 * | 7/2008 | Vardelle et al. | 118/664 |
| 7,688,441 B2 * | 3/2010 | Hertter et al. | 356/310 |
| 7,952,047 B2 * | 5/2011 | Gevelber et al. | 219/121.47 |
| 2003/0136663 A1 * | 7/2003 | Smith et al. | 204/192.13 |
| 2006/0092276 A1 * | 5/2006 | Ariglio et al. | 348/132 |
| 2006/0201917 A1 * | 9/2006 | Bohmisch et al. | 219/121.47 |
| 2007/0229808 A1 * | 10/2007 | Kondo et al. | 356/237.1 |

FOREIGN PATENT DOCUMENTS

| | | |
|---|---|---|
| JP | 10002859 A | 1/1998 |
| JP | 2001 319922 | 11/2001 |
| JP | 2005 96681 | 4/2005 |
| JP | 2005 519193 | 6/2005 |
| JP | 2006 046357 | 2/2006 |
| JP | 2007 85991 | 4/2007 |
| JP | 2010 083893 | 4/2010 |
| KR | 1019980041231 A | 8/1998 |
| KR | 1019990010957 A | 2/1999 |
| KR | 1020060105131 A | 10/2006 |
| KR | 1020070039824 A | 4/2007 |
| KR | 1020070082854 A | 8/2007 |

* cited by examiner

PLASMA MONITORING DEVICE AND METHOD

TECHNICAL FIELD

The present invention relates to a plasma monitoring device for obtaining an image of the plasma emission state so that the amount of emitted plasma is adjusted according to a measurement value obtained from analysis of the image.

BACKGROUND ART

In general, methods for treating the surface of a substrate, including removal of contaminants (e.g. organic substances) from the surface of the substrate, removal of resist, attachment of organic film, surface deformation, improved film formation, reduction of a metal oxide, and cleaning of a glass substrate for liquid crystals, are classified into wet cleaning methods using chemicals and dry cleaning methods using plasma.

Conventional wet cleaning methods using liquid chemicals have the advantages of easy processing and inexpensiveness, but have trouble in cleaning micro circuits. In addition, the use of chemicals is not environmentally-friendly.

This necessitates dry cleaning equipment using plasma, which can clean micro circuits, although the technical implementation is not easy.

Plasma mass production technology based on electric arcs at the atmospheric pressure can process a large amount of substances chemically or biologically in actual conditions, and is expected to play a pivotal role in future industries (e.g. materials, energy field, etc.) besides environmental pollution prevention and purification fields.

Low-temperature plasma generation technology is used for various purposes, including dry etching that uses plasma-activated particles, CVD (Chemical Vapor Deposition) for forming a thin film in the semiconductor field, cleaning of thin film deposition chambers for semiconductors using PFC gas, surface modification of solid substances using activated ions or electrons, and sputtering for deposition or coating of a target substrate by accelerating ions, for example, by means of the electric field so that they are incident on the target substance.

An exemplary method for surface treatment using plasma makes use of plasma in a low-temperature and low-pressure state. According to this method, plasma is generated inside a vacuum chamber of low temperature and pressure so that the plasma contacts the surface of a substrate and treats its surface. Despite excellent cleaning performance, this type of method is not widely used because the fact that a vacuum device is needed to maintain low pressure makes its application to continuous processes difficult.

There is also commercialized technology relying on atmospheric electric arcs, such as DC arc-torch. This DC arc type method is characterized in that the arc gas has a temperature of thousands of degrees, and these high-temperature characteristics are currently used to cut or weld metal. There is another type of method utilizing the radio-frequency resonance at the atmospheric pressure to cause an electric arc. The temperature of arc gas during the resulting glow or corona arc is substantially lower than that of other methods using atmospheric arcs.

Such atmospheric low-temperature plasma is used for in-line surface treatment, including cleaning and oxide deposition. If a trace of active gas is added to inactive gas, the resulting arc gas creates a large amount of active particles (e.g. ozone, radicals). The room-temperature characteristics of plasma do not cause thermal deformation of the object, and enable not only treatment of metal, but also treatment of other materials, including plastic and glass.

The atmospheric low-temperature plasma can also make a large contribution to substrate disinfection and PCB cleaning during semiconductor processes. The activity of plasma can be used for in-line treatment of organic metal byproducts of semi-conductor substrates and PCBs. The low-temperature characteristics of plasma make it possible to introduce environmentally-friendly processes that can improve product quality without causing thermal deformation of the object.

Particularly, application of a high voltage to both electrodes, which are spaced from each other, creates an electric arc in the space between them and ionizes the reaction gas. A large number of various functional ions created in this manner collide with the surface of the treated material to clean its surface and remove small alien substances.

Plasma cleaning devices using such atmospheric low-temperature plasma according to the prior art emit plasma via a number of emission nozzles to clean the substrate. In order to confirm whether plasma is emitted or not, photodiodes must be installed on the plasma emission nozzles.

However, this type of plasma monitoring based on photodiodes has a problem in that it can only determine whether plasma is being emitted or not. In other words, this approach cannot measure the amount of emitted plasma throughout the entire area. As a result, the substrate may not be cleaned evenly if plasma is supplied irregularly.

DISCLOSURE OF INVENTION

Technical Problem

Therefore, the present invention has been made in view of the above-mentioned problems, and the present invention provides a plasma monitoring device for obtaining an image of the plasma emission state and analyzing pixel information of the image by the controller so that the plasma emission state can be monitored in real time.

The present invention also provides a plasma monitoring device for controlling the amount of generated plasma by adjusting the plasma discharge condition according to the result of analysis from the controller, as well as by adjusting the amount of reaction gas supplied to the plasma supply means.

The present invention also provides a plasma monitoring device having a number of camera units arranged at a predetermined distance from each other to monitor the plasma emission state throughout the entire area so that, even if the amount of emitted plasma fluctuates in a specific area, the fluctuation can be spotted.

The present invention also provides a plasma monitoring device having plasma supply means arranged to supply plasma toward the top and bottom surfaces of the object, respectively, and camera units positioned opposite respective plasma supply means so that both surfaces of the object can be treated simultaneously.

Technical Solution

In accordance with an aspect of the present invention, there is provided a plasma monitoring device including a plasma supply means having a power supply for supplying power, a supply line for supplying a reaction gas, and an emission nozzle for emitting plasma toward an object, the plasma being generated inside the plasma supply means; a camera unit for obtaining an image of an emission state of plasma emitted from the plasma supply means; and a controller for obtaining a measurement value by converting pixel information of the image obtained by the camera unit into a numerical value and for comparing the measurement value with a reference value in a normal emission state to check the emission state of plasma, the reference value being a measurement value in the normal emission state.

Preferably, the controller is adapted to adjust the amount of emitted plasma by adjusting power supplied via the power supply of the plasma supply means to control a discharge condition of plasma according to a result of comparison between the measurement value and the reference value.

Preferably, the plasma supply means has an adjustment means on the supply line to adjust the amount of supplied reaction gas, and the controller is adapted to adjust the amount of emitted plasma by means of the adjustment means of the plasma supply means according to a result of comparison between the measurement value and the reference value.

Preferably, the plasma supply means is positioned to emit the plasma toward a surface of the object from above the object, and the camera unit is positioned toward the emission nozzle of the plasma supply means.

Preferably, a number of camera units are arranged at a predetermined distance from each other.

Preferably, a number of plasma supply means are arranged to emit the plasma toward top and bottom surfaces of the object, respectively, so that both surfaces of the object are treated, and a number of camera units are positioned opposite respective plasma supply means.

Preferably, the camera units are CCD cameras.

In accordance with another aspect of the present invention, there is provided a plasma monitoring method including the steps of generating plasma by ionization of a reaction gas caused by an electric arc and supplying the plasma toward an object; obtaining an image of an emission state of the plasma by using a camera unit; analyzing pixel information of the image to obtain a measurement value; comparing the measurement value with a reference value in a normal emission state, the reference value being a measurement value in the normal emission state; and adjusting the amount of supplied plasma when the measurement value differs from the reference value.

Preferably, in the comparing step, the measurement value is compared with the reference value to determine if the measurement value is equal to the reference value, if the measurement value is above the reference value, or if the measurement value is below the reference value.

Preferably, the adjusting step includes the steps of maintaining the amount of supplied reaction gas when the measurement value is equal to the reference value; decreasing the amount of supplied reaction gas when the measurement value is above reference value; and increasing the amount of supplied reaction gas when the measurement value is below the reference value.

Preferably, the adjusting step includes the steps of maintaining a discharge condition of plasma when the measurement value is equal to the reference value; decreasing the discharge condition of plasma when the measurement value is above reference value; and increasing the discharge condition of plasma when the measurement value is below the reference value.

Advantageous Effects

The plasma monitoring device according to the present invention is advantageous in that, by obtaining an image of the plasma emission state and analyzing pixel information of the image by the controller, the plasma emission state can be monitored in real time.

According to the result of analysis by the controller, the plasma discharge condition is adjusted to control the amount of generated plasma. The amount of reaction gas supplied to the plasma supply means is also adjusted to control the amount of generated plasma.

The device has a number of camera units arranged at a predetermined distance from each other to monitor the plasma emission state throughout the entire area. This guarantees that, even if the amount of emitted plasma fluctuates in a specific area, the fluctuation can be spotted. The amount of generated plasma is controlled based on this so that plasma can be evenly emitted through the entire area of the object.

The device has plasma supply means arranged to supply plasma to the top and bottom surfaces of the object, respectively, and camera units positioned opposite respective plasma supply means so that both surfaces of the object can be treated simultaneously.

BRIEF DESCRIPTION OF THE DRAWINGS

The foregoing and other objects, features, and advantages of the present invention will become more apparent from the following detailed description when taken in conjunction with the accompanying drawings in which.

BEST MODE FOR CARRYING OUT THE INVENTION

Hereinafter, exemplary embodiments of the present invention will be described with reference to the accompanying drawings.

MODE FOR THE INVENTION

Figure 1:
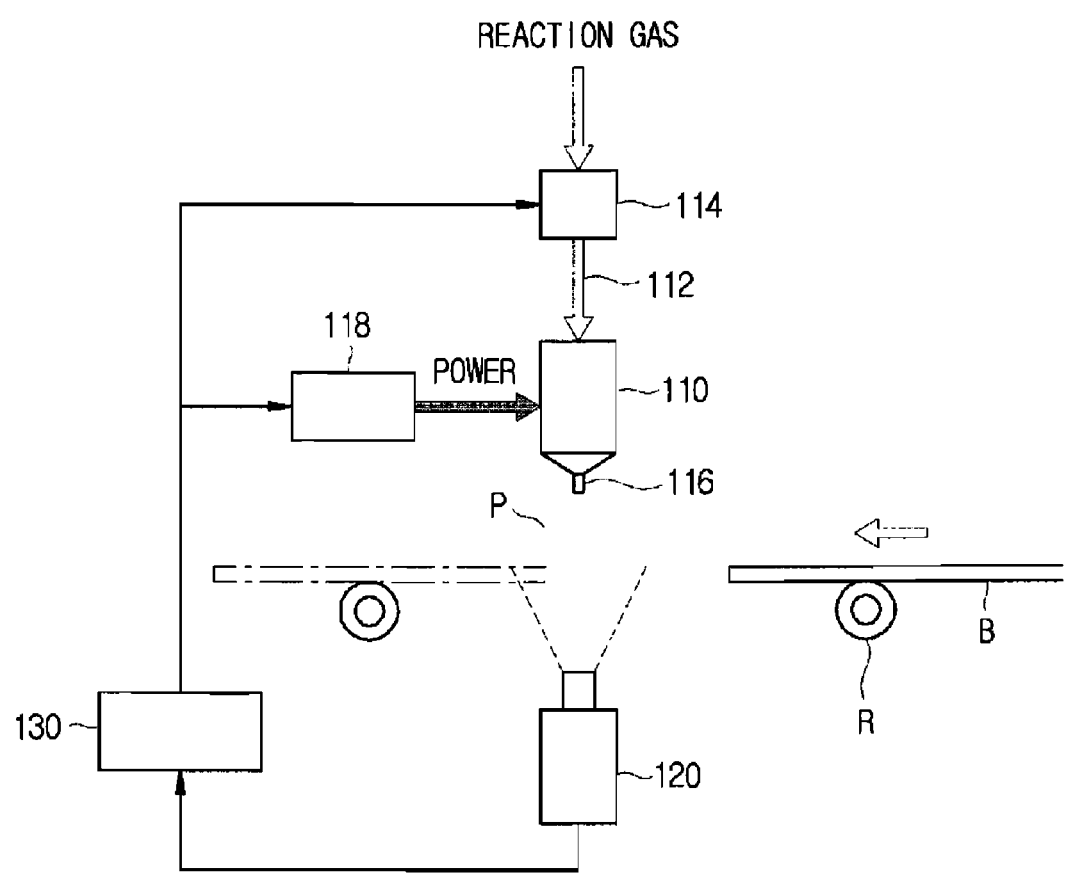
FIG. 1 is a front sectional view of a plasma monitoring device according to the present invention.
Figure 2:
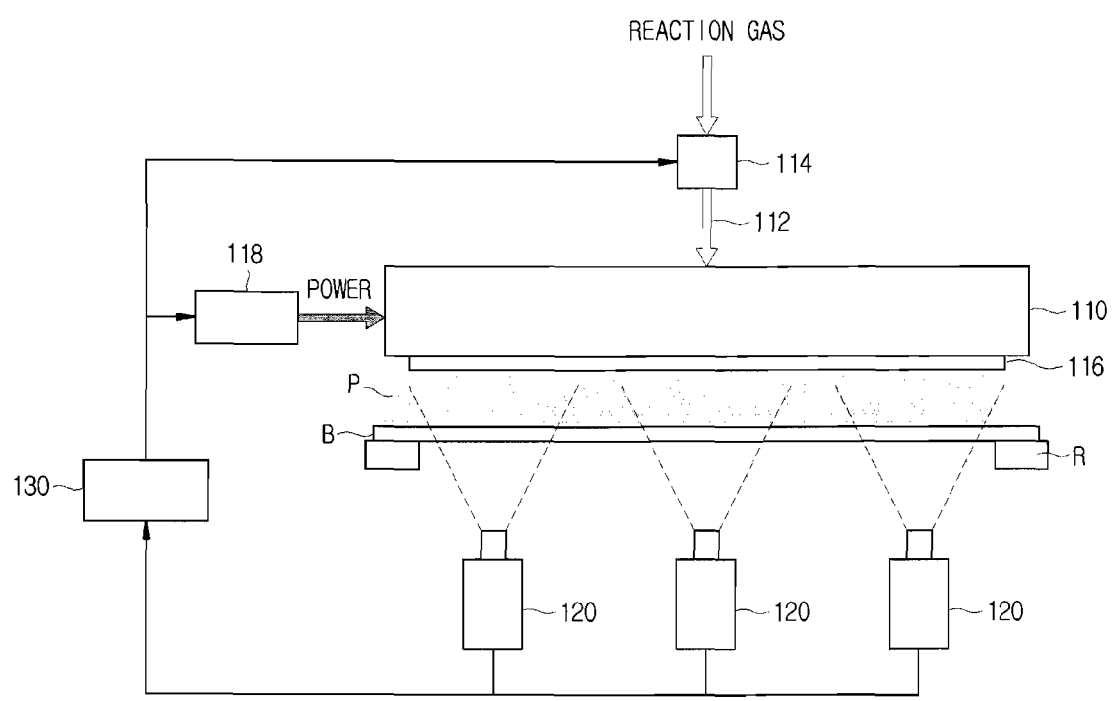
FIG. 2 is a lateral sectional view of a plasma monitoring device according to the present invention.

FIG. 1 is a front sectional view of a plasma monitoring device according to the present invention, and FIG. 2 is a lateral sectional view of a plasma monitoring device according to the present invention.

As shown in the drawings, the plasma monitoring device according to the present invention is applied to a device for plasma cleaning, plasma ashing, or plasma etching, and includes a plasma supply means 110 for emitting plasma P toward an object B, camera units 120 positioned toward the plasma supply means 110, and a controller 130 for analyzing images obtained by the camera units 120.

The plasma supply means 110 receives power and ionizes a reaction gas contained therein to generate plasma. The plasma supply means 110 includes a supply line 112 for supplying a reaction gas, an adjustment means 114 formed on the supply line 112 to adjust the amount of supplied reaction gas, a power supply 118 for applying power of predetermined voltage and frequency and creating an electric an arc in the space between both electrodes so that the resulting ionization of the reaction gas generates plasma, and a slit-type emission nozzle 116 for emitting plasma P generated therein. The plasma supply means is centrally positioned above the feed roller R so that the emission nozzle 116 is directed toward the object B (e.g. substrate).

The camera units 120 are centrally positioned below the feed roller R toward the plasma supply means 110. A number of camera units 120 are arranged at a predetermined distance from each other to obtain images of the plasma emission state throughout the entire area. CCD (Charge Coupled Device) cameras are used as the camera units 120 to obtain color or black/white images of the emission state of the plasma P emitted from the emission nozzle 116 of the plasma supply means 110.

The controller 130 analyzes images obtained by the camera units 120 to measure the amount of supplied plasma P. The measurement value is analyzed to determine whether the supply of plasma P is excessive or insufficient. According to the result of measurement, the amount of supplied reaction gas is adjusted by the adjustment means 114 of the plasma supply means 110. Alternatively, the voltage and frequency of the power are adjusted by the power supply 118 to adjust the plasma discharge condition and adjust the amount of emitted plasma.

The operation of the plasma monitoring device according to the present invention, which has the above-mentioned construction, will now be described.

Referring to FIG. 1, the plasma supply means 110 is supplied with a reaction gas at predetermined pressure by means of the adjustment means 114 formed on the supply line 112. Application of power of predetermined voltage and frequency generates plasma P from the reaction gas supplied to the plasma supply means 110, and the plasma P is emitted via the emission nozzle 116 on the leading end.

The plasma P collides with the surface of the object B, which is fed by the feed roller R, below the plasma supply means 110 to clean the surface of the object B and remove micro substances.

In order to measure the amount of plasma P emitted from the emission nozzle 116 of the plasma supply means 110, camera units 120 are installed below the feed roller R, which feeds the object B, and are positioned toward the emission nozzle 116 of the plasma supply means 110.

The camera units 120 consist of CCD cameras, and obtain color or black/white images of the emission state of the plasma P emitted from the emission nozzle 116 of the plasma supply means 110. The controller 130 analyzes the obtained images so that the adjustment means 114 adjusts the amount of reaction gas supplied to the plasma supply means 110. In addition, the plasma discharge condition is controlled by the power supply 118 to control the amount of emitted plasma P.

The plasma supply means 110 has a slit-type emission nozzle 116, as shown in FIG. 2, so that plasma can be evenly supplied toward the object B according to its size.

In other words, the emission nozzle 116 has the shape of a slit extending along the width of the object B so that plasma P is evenly emitted to the object B.

In order to monitor the emission state of plasma P, which is emitted from the slit-type emission nozzle 116 of the plasma supply means 110, throughout the entire area, a number of camera units 120 are installed below the feed roller R at a predetermined distance from each other.

The camera units 120 are arranged at a predetermined distance from each other in accordance with the range of photography by the CCD cameras so that the emission state of plasma emitted from the emission nozzle 116 of the plasma supply means 110 can be monitored throughout the entire area.

The controller 130 analyzes pixel information of the images obtained by the camera units 120 to control the adjustment means 114, which supplies a reaction gas to the plasma supply means 110, or to control the power supply 118, which supplies the plasma supply means 110 with power, so that the amount of generated plasma P is adjusted.

The controller 130 analyzes the black/white or color images obtained by the camera units 120 in the following manner: in the case of a black/white image, each pixel information is stored as a value in the range of 0-255 based on the luminosity; and, in the case of a color image, each pixel information of the image is stored as a value in the rage of 0-255 based on the L (luminosity) and S (saturation) of R (red), G (green), and B (blue).

More particularly, the controller 130 analyzes pixel information around the emission nozzle 116, from which plasma P is emitted, based on images obtained by the camera units 120. The controller 130 obtains a measurement value from the result of analysis and compares the measurement value with a reference value, which is a measurement value in a normal emission state, to evaluate the plasma P supply state.

Figure 3:
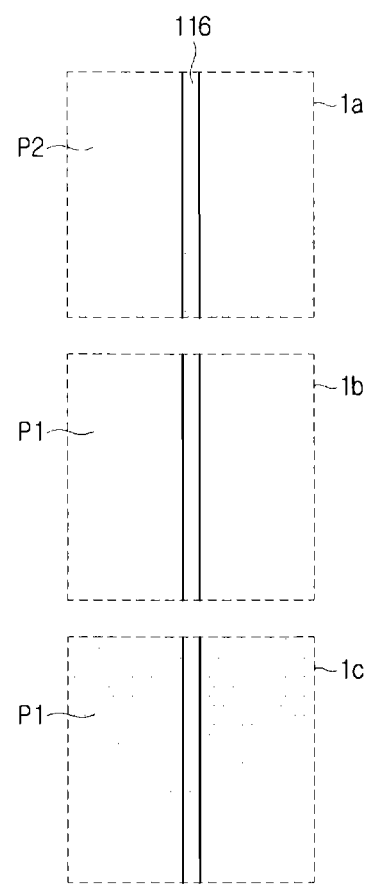
FIGS. 3 and 4 briefly show images obtained by camera units of a plasma monitoring device according to the present invention.
Figure 4:
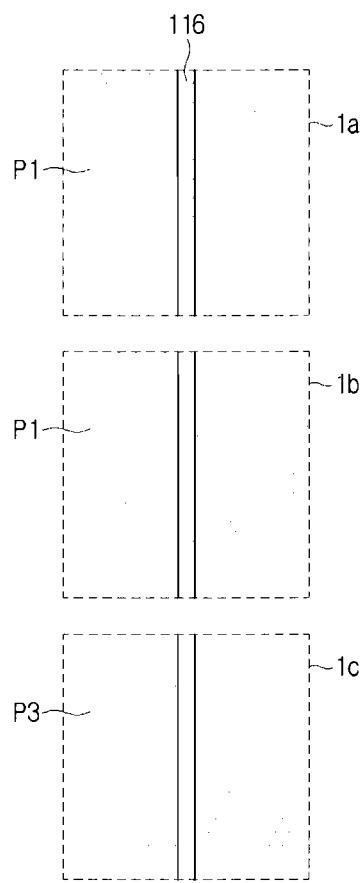

It will be assumed for example that images Ia, Ib, and Ic have been obtained by the camera units 120 based on a reference value in the range of 95-105, as shown in FIG. 3. If the measurement value P1 of the images Ib and Ic corresponding to the emission nozzle 116 is equal to the reference value or falls within the reference value range, it is determined that plasma supply is normal. If the measurement value P2 of the image Ia is above the reference value, it is determined that plasma supply is excessive. Among images Ia, Ib, and Ic obtained by the camera units 120 shown in FIG. 4, if the measurement value P3 of the image Ic is below the reference value, it is determined that plasma supply is insufficient.

According to the result of the measurement value, the controller 130 adjusts the adjustment means 114 formed on the reaction gas supply line 112 to increase or decrease the amount of reaction gas supplied to the plasma supply means 110. The controller 130 also controls the frequency and voltage of power supplied by the power supply 118 to adjust the amount of generated plasma. Such adjustment of the reaction gas or supplied power guarantees that the amount of supplied plasma remains within the reference value range.

That is, in order to prevent the object from being treated unevenly due to fluctuation of the amount of supplied plasma (i.e. when the amount of generated plasma is not constant even in the same condition), a number of CCD cameras photograph the plasma emission state throughout the entire area, and the pixel information of obtained images is analyzed. If it is determined that the amount of emitted plasma is not constant, the amount of supplied reaction gas or supplied power is varied to obtain desired plasma supply, as mentioned above.

Figure 5:
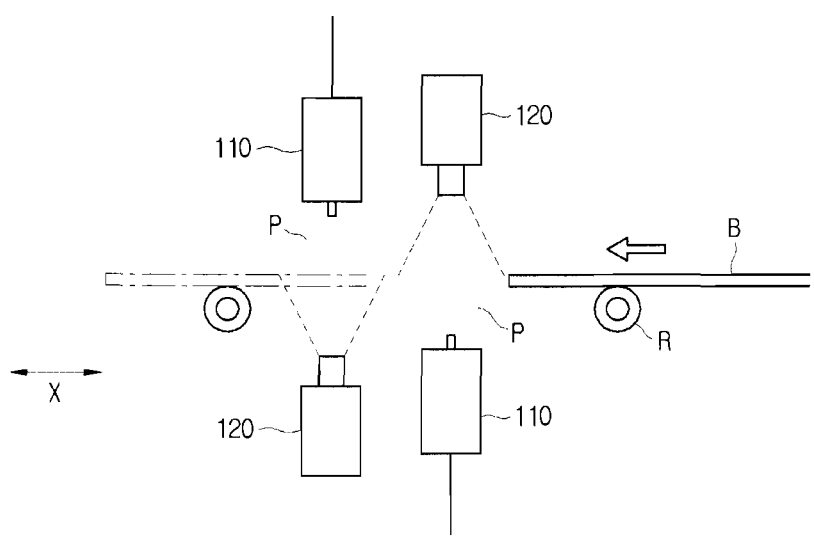
FIG. 5 is a sectional view of a plasma monitoring device according to another embodiment of the present invention.

Referring to FIG. 5, it is also possible to arrange plasma supply means 110 at a predetermined interval in the X-axis direction in such a manner that they face the top and bottom surfaces of the object B alternately to avoid interference with each other. In this case, camera units 120 may be arranged opposite respective plasma supply means 110 so that the top and bottom surfaces of the object B can be treated simultaneously.

Figure 6:
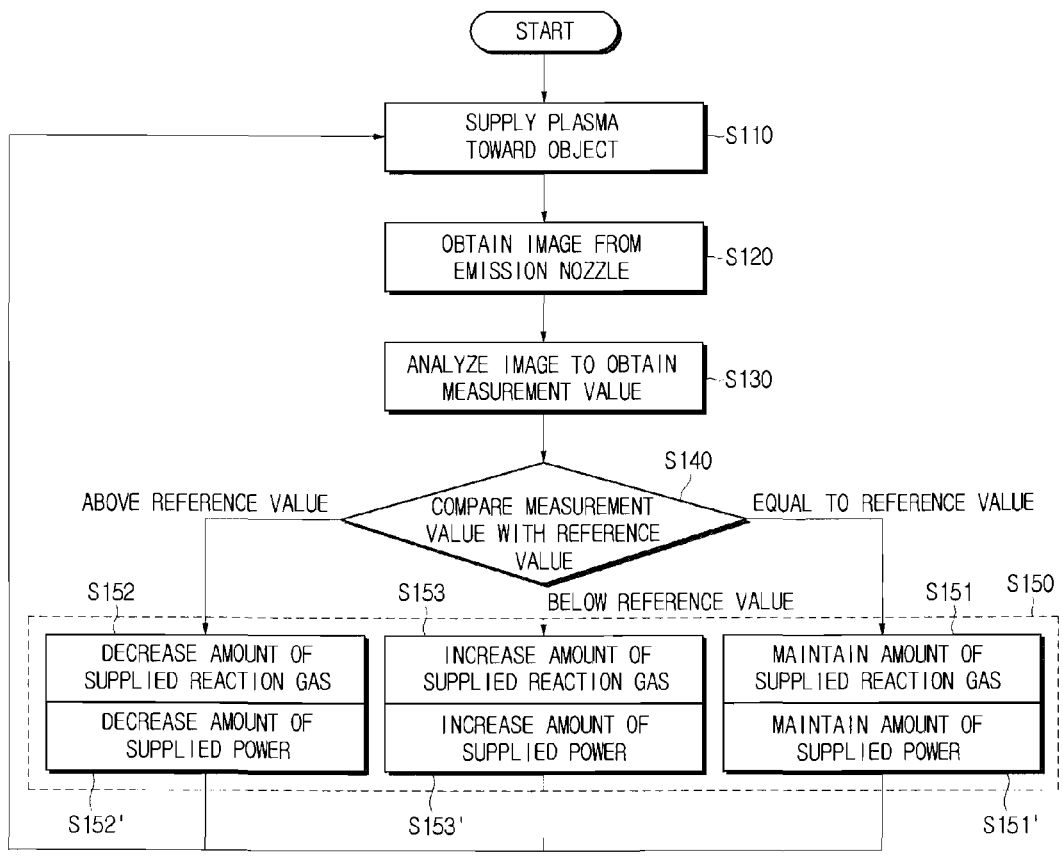
FIG. 6 is a flowchart of a plasma monitoring method according to the present invention.

FIG. 6 is a flowchart of a plasma monitoring method according to the present invention.

Referring to FIG. 6, the plasma monitoring method according to the present invention includes the steps of supplying plasma (S110), obtaining images (S120), analyzing the images to obtain a measurement value (S130), comparing the measurement value with a reference value (S140), and adjusting the amount of generated plasma according to the result of comparison (S150).

A series of steps of the plasma monitoring method according to the present invention will be described in more detail. While the feed roller feeds the object, the plasma supply means supply plasma toward the object (S110) to treat it.

The camera units, which are positioned opposite the plasma supply means, obtain images of the emission state of the plasma emitted from the plasma supply means (S120). The controller analyzes the images to obtain pixel information regarding the corresponding portion of the emission nozzle, from which plasma is emitted, as a measurement value, which is an integer in the range of 0-255 (S130).

The measurement value obtained from the pixel information of images is compared with a reference value, which is a measurement value in a normal emission state, (S140) to determine if the measurement value is equal to the reference value, if the measurement value is above the reference value, or if the measurement value is below the reference value.

The reference value has been set to be equal to a measurement value corresponding to a normal plasma emission state. It is also possible to set a range of reference values so that, if the measurement value falls within the range, the plasma emission state is considered normal.

According to the result in the comparison step (S140), the amount of generated plasma is adjusted by the adjustment means (S150).

If it is determined in the comparison step (S140) that the measurement value is equal to the reference value, or if the measurement value falls within the range of reference values, the plasma emission state is considered acceptable, and the amount of reaction gas supplied to the plasma supply means remains unchanged (S151). The frequency and voltage of power supplied to the plasma supply means also remain intact (S151') to maintain the amount of generated plasma.

If the measurement value is above the reference value, it is considered that plasma is emitted excessively. Then, the amount of supplied reaction gas is decreased by the adjustment means formed on the supply line, which supplies the plasma supply means with a reaction gas (S152). In addition, the frequency and voltage of power supplied to the plasma supply means are decreased (S152') so that a smaller amount of plasma is generated.

If the measurement value is below the reference value, it is considered that plasma is emitted insufficiently. Then, the amount of supplied reaction gas is increased by the adjustment means (S153), and the frequency and voltage of power supplied to the plasma supply means are increased (S153') so that a larger amount of plasma is generated.

As such, the amount of plasma generated in the plasma supply step (S110) is adjusted by controlling the amount of reaction gas supplied to generate plasma and varying the power for causing an electric arc to ionize the reaction gas.

After the amount of generated plasma is adjusted in the adjustment step (S150), plasma is supplied in the adjusted state, and the series of steps are conducted successively so that the plasma measurement value remains within the range of reference values.

Although several exemplary embodiments of the present invention have been described for illustrative purposes, those skilled in the art will appreciate that various modifications, additions and substitutions are possible, without departing from the scope and spirit of the invention as disclosed in the accompanying claims.

INDUSTRIAL APPLICABILITY

As mentioned above, the plasma monitoring device according to the present invention is advantageous in that, by obtaining images of the plasma emission state and analyzing pixel information of the images by the controller, the plasma emission state can be monitored in real time.

The invention claimed is:
1. A plasma monitoring device comprising:
a plasma supplier including a power supply for supplying power, a supply line for supplying a reaction gas, and an emission nozzle for emitting plasma toward an object, the plasma being generated inside the plasma supplier;
a camera unit positioned adjacent to one side of the object facing toward the emission nozzle of the plasma supplier that is positioned adjacent to the other side of the object for obtaining an image of an emission state of plasma emitted from the plasma supplier; and
a controller for obtaining a measurement value by converting pixel information of the image obtained by the camera unit into a numerical value and for comparing the measurement value with a reference value in a normal emission state to check the emission state of plasma, the reference value being a measurement value in the normal emission state.

2. The plasma monitoring device as claimed in claim 1, wherein the controller is adapted to adjust the amount of emitted plasma by adjusting power supplied via the power supply of the plasma supplier to control a discharge condition of plasma according to a result of comparison between the measurement value and the reference value.

3. The plasma monitoring device as claimed in claim 1, wherein the plasma supplier includes an adjuster on the supply line to adjust the amount of supplied reaction gas, and the controller is adapted to adjust the amount of emitted plasma through the adjuster of the plasma supplier according to a result of comparison between the measurement value and the reference value.

4. The plasma monitoring device as claimed in claim 1, wherein the plasma supplier is positioned to emit the plasma toward a surface of the object from above the object.

5. The plasma monitoring device as claimed in claim 1, wherein a number of camera units are arranged at a predetermined distance from each other.

6. The plasma monitoring device as claimed in claim 1, wherein a number of plasma suppliers are arranged to emit the plasma toward top and bottom surfaces of the object, respectively, so that both surfaces of the object are treated, and a number of camera units are positioned opposite respective plasma suppliers.

7. The plasma monitoring device as claimed in claim 1, wherein the camera unit is a charge coupled device (CCD) camera.

* * * * *

UNITED STATES PATENT AND TRADEMARK OFFICE
CERTIFICATE OF CORRECTION

| | | Page 1 of 1 |
|---|---|---|
| PATENT NO. | : 8,416,293 B2 | |
| APPLICATION NO. | : 12/595365 | |
| DATED | : April 9, 2013 | |
| INVENTOR(S) | : Heung Hyun Shin et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 745 days.

Signed and Sealed this
Thirteenth Day of May, 2014

Michelle K. Lee
*Deputy Director of the United States Patent and Trademark Office*